(12) United States Patent
Yang (10) Patent No.: US 11,894,094 B1
(45) Date of Patent: Feb. 6, 2024

(54) ELECTRONIC DEVICE AND METHOD OF CONTROLLING THE SAME

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/966,107

(22) Filed: Oct. 14, 2022

(51) Int. Cl.
*G11C 5/14* (2006.01)
*G05F 1/575* (2006.01)
*G05F 1/46* (2006.01)
*H02M 3/07* (2006.01)

(52) U.S. Cl.
CPC .............. *G11C 5/147* (2013.01); *G05F 1/465* (2013.01); *G05F 1/575* (2013.01); *H02M 3/07* (2013.01)

(58) Field of Classification Search
None
See application file for complete search history.

(56) References Cited

U.S. PATENT DOCUMENTS

| | | | | |
|---|---|---|---|---|
| 7,656,225 B2 * | 2/2010 | Isobe | | G11C 5/147 |
| | | | | 327/540 |
| 7,816,976 B2 * | 10/2010 | Ogiwara | | G05F 3/30 |
| | | | | 327/539 |
| 7,834,679 B2 * | 11/2010 | Kushima | | H03K 17/063 |
| | | | | 327/427 |
| 7,876,079 B2 * | 1/2011 | Nirschl | | G11C 5/147 |
| | | | | 323/283 |
| 8,896,363 B2 * | 11/2014 | Chen | | H03K 17/687 |
| | | | | 327/437 |
| 9,459,641 B2 * | 10/2016 | Sakaguchi | | G05F 1/5735 |
| 9,740,220 B2 * | 8/2017 | Ikeda | | G05F 1/56 |
| 10,730,073 B2 * | 8/2020 | Ghisu | | G01S 7/52079 |
| 11,463,087 B2 * | 10/2022 | Genc | | H03K 17/693 |
| 2006/0120196 A1 * | 6/2006 | Jeon | | G11C 16/30 |
| | | | | 365/226 |
| 2011/0248688 A1 * | 10/2011 | Iacob | | G05F 1/575 |
| | | | | 323/234 |

* cited by examiner

*Primary Examiner* — Thomas J. Hiltunen
(74) *Attorney, Agent, or Firm* — Muncy, Geissler, Olds & Lowe, P.C.

(57) ABSTRACT

An electronic device and a method of controlling an electronic device are provided. The electronic device includes a first transistor having a first resistor, second resistor, first transistor, and second transistor. The second resistor is connected to the first resistor. The first transistor is connected to the first resistor in parallel and has a first bulk. The second transistor is connected to the second resistor in parallel and has a second bulk. The first bulk of the first transistor receives a first voltage and the first bulk of the second transistor receives a second voltage. The first voltage and the second voltage are different.

13 Claims, 6 Drawing Sheets

ELECTRONIC DEVICE AND METHOD OF CONTROLLING THE SAME

TECHNICAL FIELD

The present disclosure relates to an electronic device and method of controlling the same, and more particularly, to an electronic device including a voltage divider.

DISCUSSION OF THE BACKGROUND

An integrated circuit (IC) can include a plurality of circuit portions requiring different supply voltages. A voltage generator can generate different supply voltages. Hence, a voltage generator with improved structure is of interest for IC design.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides an electronic device including a first transistor having a first resistor, second resistor, first transistor, and second transistor. The second resistor is connected to the first resistor. The first transistor is connected to the first resistor in parallel and has a first bulk. The second transistor is connected to the second resistor in parallel and has a second hulk. The first bulk of the first transistor receives a first voltage and the first bulk of the second transistor receives a second voltage. The first voltage and the second voltage are different.

Another aspect of the present disclosure provides an electronic device including a voltage divider, an output terminal, and a bulk voltage circuit. The voltage divider includes a first variable resistor circuit and a second variable resistor circuit, The output terminal is connected to the voltage divider. The bulk voltage circuit is configured to generate a first voltage and a second, different, voltage based on a supply voltage at the output terminal. The first variable resistor circuit receives the first voltage and the second variable resistor circuit receives the second voltage.

Another aspect of the present disclosure provides a method of controlling an electronic device, including determining a first resistance of a first variable resistor circuit by turning a first transistor on or off, determining a second resistance of a second variable resistor circuit by turning a second transistor on or off, providing a first voltage to a first bulk of the first transistor, providing a second voltage to a second bulk of the second transistor, wherein the first voltage and the second voltage are different, and determining a supply voltage based on the first resistance and the second resistance.

The electronic device of the present disclosure includes a first transistor having a first resistor, second resistor, first transistor, and second transistor. The second resistor is connected to the first resistor. The first transistor is connected to the first resistor in parallel and has a first hulk. The second transistor is connected to the second resistor in parallel and has a second bulk. The first bulk of the first transistor receives a first voltage and the first bulk of the second transistor receives a second voltage. The first voltage and the second voltage are different, e.g., the second voltage is lower than the first voltage. When the first transistor and the second transistor are turned off, the first resistor and the second resistor are configured to divide a supply voltage at a terminal of the first resistor. The supply voltage is distributed to the first resistor and the second resistor which are applied to the source or drain of the first transistor and the second transistor, respectively. The reverse voltage across source/drain and the hulk of the second transistor is in a moderate range. As such, the reverse leakage current between a junction of the source/drain and the bulk of the first and second transistors can be relatively low, or negligible. Hence, the equivalent resistance of the junction of the source/drain and the bulk of the first and second transistors can be sufficiently high to be considered an open circuit. Thus, the equivalent resistance of the moderately, reverse-biased junction of the source/drain and the bulk of the first and second transistors may not influence the voltage division of the first resistor and the second resistor. Furthermore, the electronic device may include more connected resistors and transistors respectively connected to the corresponding resistors in parallel. The electronic device of the present disclosure generates a plurality of different voltages to the bulks of the transistors. As such, the voltage across the junction of the source/drain and the bulk of each of the transistors can be within a moderate range or at a moderate value. The junction leakage current therebetween may be relatively low and thus, high equivalent resistance of the junction would not influence the voltage division of the plurality of resistors.

The foregoing has outlined rather broadly the features and technical advantages of the present disclosure so that the detailed description of the disclosure that follows may be better understood, Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
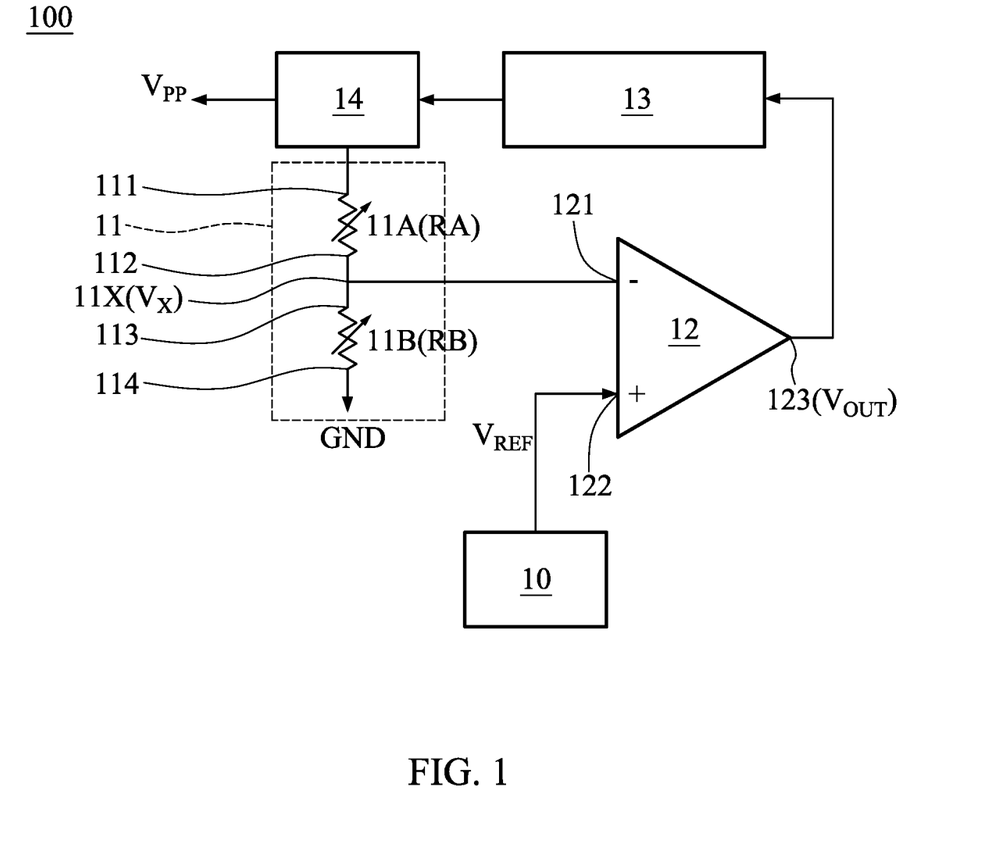
FIG. 1 is a schematic diagram of an electronic device in accordance with some embodiments of the present disclosure.

FIG. 1 is a block diagram of an electronic device 100 in accordance with some embodiments of the present disclosure. The electronic device 100 includes a reference voltage source 10, a voltage divider 11, a comparator 12, a voltage pumping control circuit 13, and an output terminal 14. The reference voltage source 10 is electrically connected to the comparator 12. The voltage divider 11 is electrically connected to comparator 12. The comparator 12 is electrically connected to the voltage pumping control circuit 13. The voltage pumping control circuit 13 may electrically connect the comparator 12 and the output terminal 14. The voltage pumping control circuit 13 is electrically connected to the output terminal 14. The output terminal 14 is electrically connected to the voltage divider 11.

In some embodiments, an integrated circuit (IC) may be applied with a single supply voltage $V_{DD}$ and may include a plurality of circuit portions which require different supply voltages. In some embodiments, a dynamic random access memory (DRAM) may require different supply voltages, such as $V_{DD}$ for a logic circuit, $V_{PP}$ for word lines, $V_{DDQ}$ for an output buffer, etc. Therefore, the IC may be integrated with an electronic device to provide the different supply voltages. The electronic device 100 is applied with the supply voltage $V_{DD}$ and configured to generate a supply voltage $V_{PP}$, different from the supply voltage $V_{DD}$, at the output terminal 14. In order to stabilize the supply voltage $V_{PP}$, the voltage divider 11 functions as a feedback loop for the comparator 12. When the supply voltage VPP is different from a predetermined value, the comparator 12 provides an output signal $V_{OUT}$ to the voltage pumping control circuit 13. The voltage pumping control circuit 13 is configured to adjust the supply voltage $V_{PP}$ based on the output signal $V_{OUT}$.

The reference voltage source is configured to generate a reference voltage $V_{REF}$. The comparator 12 includes a first input 121, a second input 122, and an output 123. The first input 121 of the comparator 12 may be a "negative input" of the comparator. In an alternative embodiment, the first input 121 of the comparator 12 may be a "positive input" of the comparator. In an alternative embodiment, the second input 122 of the comparator 12 may be a "positive input" of the comparator. The comparator 12 may be configured to compare the voltages received by the first input 121 and the second input 122 to generate an output signal $V_{OUT}$ at the output 123. The comparator 12 may include an operational amplifier. The comparator 12 may include a plurality of active components and a plurality of passive components.

The voltage pumping control circuit 13 is configured to pump the supply voltage VPP based on the output signal $V_{OUT}$. In some embodiments, when the output signal $V_{OUT}$ has a logic high value, the voltage pumping control circuit 13 may increase the supply voltage VPP. In some embodiments, when the output signal $V_{OUT}$ has a logic low value, the voltage pumping control circuit 13 may decrease the supply voltage VPP.

The voltage divider 11 includes a variable resistor circuit (or a first variable resistor circuit) 11A and a variable resistor circuit (or a second variable resistor circuit) 11B. The variable resistor circuit 11A has a first terminal 111 connected to the output terminal 14 and a second terminal 112. The variable resistor circuit 11B has a first terminal 113 connected to the second terminal 112 of the variable resistor circuit 11A and a second terminal 114 connected to a ground GND. In some embodiments, the second terminal 114 may be connected to a common ground voltage (e.g., $V_{SS}$). The voltage divider 11 may have a node 11X between the variable resistor circuit 11A (or the second terminal 112) and the variable resistor circuit 11B (or the first terminal 113). The node 11X is connected to the first input 121 of the comparator 12. The variable resistor circuit 11A has a resistance RA, which can be adjusted, and the variable resistor circuit 11B has a resistance RB, which can be adjusted. The ratio of a voltage $V_X$ at the node 11X and the supply voltage $V_{PP}$ equals RB/(RA+RB). The relevant descriptions will be discussed in detail as follows.

Figure 2:
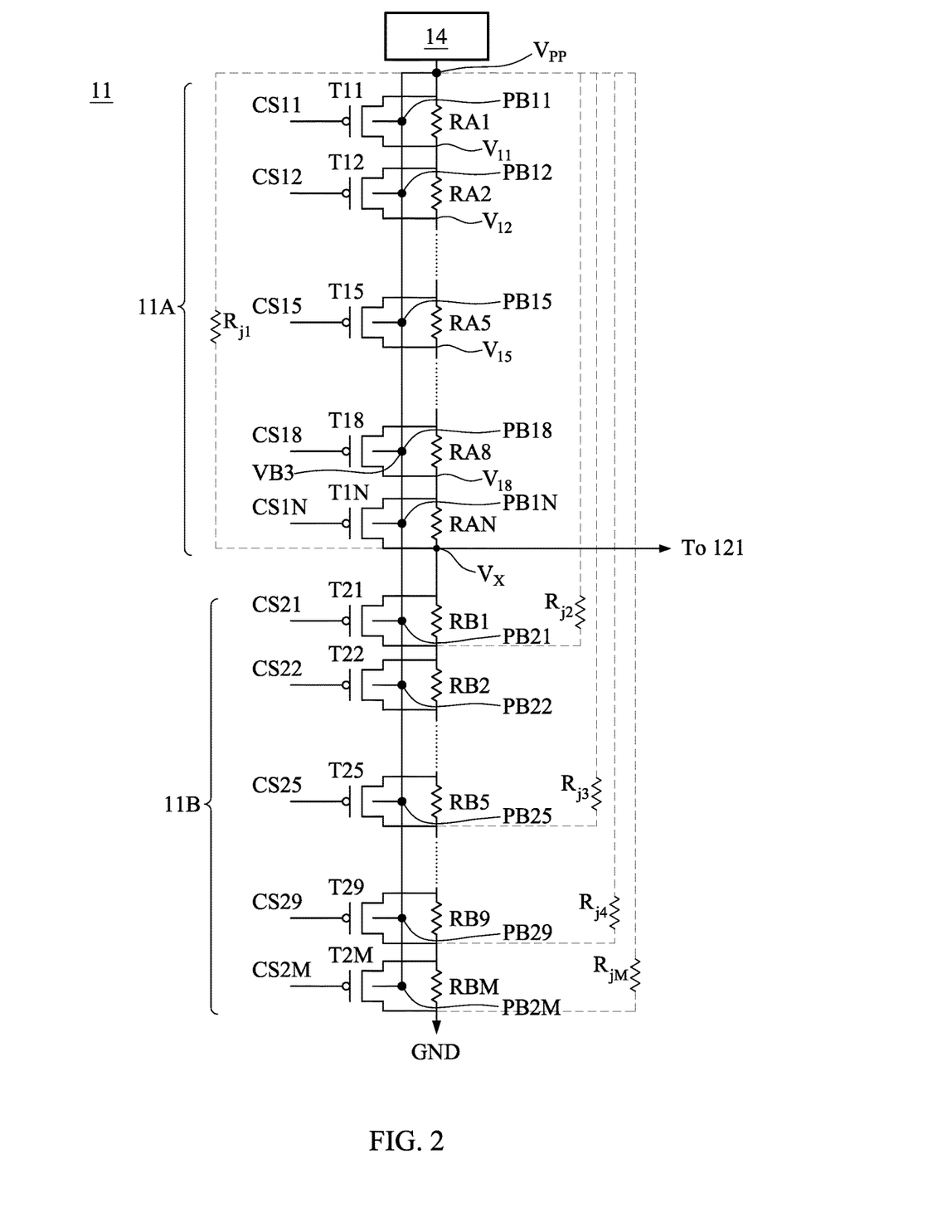
FIG. 2 is a schematic diagram of a voltage divider in accordance with some embodiments of the present disclosure.

FIG. 2 is a schematic diagram of the voltage divider 11 in accordance with some embodiments of the present disclosure. The variable resistor circuit 11A of voltage divider 11 includes a plurality of transistors T11 to T1N, wherein the N is a positive integer. FIG. 2 illustrates transistors T11, T12, T15, T18, and T1N for the purpose of brevity. The variable resistor circuit 11A may include transistors T13, T14, T16, or the like (not shown). The transistors T11, T12, T15, T18, and T1N may each include a MOS field-effect transistor (FET). The transistors T11, T12, T15, T18, and T1N may each include a p-type MOSFET or an n-type MOSFET. The exemplary transistor as shown in FIG. 2 for the transistor T11, T12, T15, T18, and T1N will be a p-type MOSFET.

The variable resistor circuit 11A includes resistors RA1 to RAN. FIG. 2 illustrates resistors RA1, RA2, RA5, RA8, and RAN for the purpose of brevity. The variable resistor circuit 11A may include resistors RA3, RA4, RA6, or the like (not shown). The resistors RA1, RA2, RA5, RA8, and RAN may each include a solder mounting device (SMD) or a transistor operating as a resistor.

The transistor T11 has a gate configured to receive a control signal CS11, a source connected to the output terminal 14 or the first terminal 111 of the first variable circuit 11A and configured to receive the supply voltage $V_{PP}$, and a drain connected to a source of the transistor T12. The resistor RA1 is connected to the transistor T11 in parallel. In some embodiments, the resistor RA1 has a terminal connected to the source of the transistor T11 and an opposite terminal connected to the drain of the transistor T11. The transistor T11 may be turned on or off based on the control signal CS11. When the transistor T11 is turned on, the resistor RA1 will be bypassed. The resistance of the variable resistor circuit 11A may decrease. When the transistor T11 is turned off, a portion of the supply voltage $V_{PP}$ will cross the resistor RA1. The resistance of the first variable resistor circuit 11A may increase.

Similarly, the transistors T12, T15, T18, and T1N each respectively have a gate configured to receive control signals CS12, CS15, CS18, and CS1N. The transistor T12 has a drain connected to a source of the next transistor (e.g., the transistor T13 (not shown)). The transistor T15 has a source connected to a drain of the previous transistor (e.g., the transistor T14 (not shown)) and a drain connected to a source of the next transistor (e.g., the transistor T16 (not shown)). The transistor T18 has a source connected to a drain of the previous transistor (e.g., a transistor T17 (not shown)) and a drain connected to a source of the next transistor (e.g., the transistor T1N). The transistor T1N has a source connected to a drain of the previous transistor (e.g., a transistor T1(N-1)) and a drain connected to the node $V_X$ or the second terminal 112 of the first variable circuit 11A. The resistors RA2 to RAN are respectively connected to the transistors T12 to T1N in parallel. In some embodiments, the resistors RA2 to RAN each have a terminal connected to the source of the corresponding one of the transistors T12 to T1N and an opposite terminal connected to the drain of the corresponding one of the transistors T12 to T1N. The transistors T12 to T1N may each be turned on or off based on the corresponding one of the control signals CS12 to CS1N. When one or more of the transistors T12 to T1N are turned on, the corresponding one or more of the resistors RA1 to RAN will be bypassed. The resistance of the variable resistor circuit 11A may decrease. When one or more of the transistors T12 to T1N are turned off, a portion of the supply voltage $V_{PP}$ crosses the corresponding one or more of the resistors RA1 to RAN. The resistance of the variable resistor circuit 11A may increase.

The resistance RA of the variable resistor circuit 11A can be adjusted based on the states of the transistor T11 to T1N. The resistance RA of the variable resistor circuit 11A is in a range from around 0Ω (assuming the equivalent resistance of the on-state transistors can be neglected) to the sum of the resistance of the resistors RA1 to RAN. In the following discussions, the resistance of the resistors RA1 to RAN will be also indicated as RA1 to RAN, respectively.

The variable resistor circuit 11B of voltage divider 11 includes a plurality of transistors T21 to T2M, wherein the M is a positive integer. FIG. 2 illustrates transistors T21, T22, T25, T28, and T2M for the purpose of brevity. The variable resistor circuit 111 may include transistors T23, T24, T26, or the like (not shown). The transistors T21, T22, T25, T28, and T2M may each include a MOSFET. The transistors T21, T22, T25, T28, and T2M may each include a p-type MOSFET or an n-type MOSFET. The exemplary transistor as shown in FIG. 2 for the transistor T21, T22, T25, T28, and T2M will be a p-type MOSFET.

The variable resistor circuit 11B includes resistors RB1 to RBM. FIG. 2 illustrates resistors RB1, RB2, RB5, RB8, and RBM for the purpose of brevity. The variable resistor circuit 11B may include resistors RB3, RB4, RB6, or the like (not shown). The resistors RB1, RB2, RB5, RB8, and RBM may each include a solder mounting device (SMD) or a transistor operating as a resistor.

The transistor T21 has a gate configured to receive a control signal CS21, a source connected to the node 11X, the drain of the transistor T1N, and configured to receive the supply voltage $V_{PP}$, a drain connected to a source of the transistor T22. The resistor RB1 is connected to the transistor T21 in parallel. In some embodiments, the resistor RB1 has a terminal connected to the source of the transistor T21 and an opposite terminal connected to the drain of the transistor T21. The transistor T21 may be turned on or off based on the control signal CS21. When the transistor T21 is turned on, the resistor RB1 will be bypassed. The resistance of the variable resistor circuit 11B may decrease. When the transistor T21 is turned off, a portion of the supply voltage $V_{PP}$ will drop on the resistor RB1, or a portion of the voltage $V_X$ at the node 11X will drop on the resistor RB1. The resistance of the variable resistor circuit 11B may increase.

Similarly, the transistors T22, T25, T28, and T2M respectively have a gate configured to receive control signals CS22, CS25, CS28, and CS2M. The transistor T22 has a drain connected to a source of the next transistor (e.g., the transistor T23 (not shown)). The transistor T25 has a source connected to a drain of the previous transistor (e.g., the transistor T24 (not shown)) and a drain connected to a source of the next transistor (e.g., the transistor T26 (not shown)). The transistor T28 has a source connected to a drain of the previous transistor (e.g., a transistor T27 (not shown)) and a drain connected to a source of the next transistor (e.g., the transistor T2M). The transistor T2M has a source connected to the previous transistor (e.g., a transistor T2(M-1)) and a drain connected to the ground (or the common ground voltage $V_{SS}$) or the second terminal 114 of the second variable resistor circuit 11B. The resistors RB2 to RBM are respectively connected to the transistors T22 to T2M in parallel. In some embodiments, the resistors RB2 to RBM each have a terminal connected to the source of the corresponding one of the transistors T22 to T2M and an opposite terminal connected to the drain of the corresponding one of the transistors T22 to T2M. The transistors T22 to T2M may each be turned on or off based on the corresponding one of the control signals CS22 to CS2M. When one or more of the transistors T22 to T2M are turned on, the corresponding one or more of the resistors RB1 to RBM will be bypassed. The resistance of the variable resistor circuit 11B may decrease. When one or more of the transistors T22 to T2M are turned off, a portion of the supply voltage $V_{PP}$ will drop on the corresponding one or more of the resistors RB1 to RBM. The resistance of the variable resistor circuit 11B may increase.

The resistance RB of the variable resistor circuit 11B can be adjusted based on the states of the transistor T21 to T2M. The resistance RB of the variable resistor circuit 11B is in a range from around 0Ω (assuming the equivalent resistance of the on-state transistors can be neglected) to the sum of the resistance of the resistors RB1 to RBM. In the following discussions, the resistance of the resistors RB1 to RBM is also indicated as RB1 to RBM, respectively.

In some embodiments, the resistors RA1 to RAN may be the same In some embodiments, the resistors RB1 to RBM may be the same. In some embodiments, the resistance RAN may be higher than to the resistance RBM. For example, the resistance RAN may be ten times the resistance RBM.

Based on the voltage divider rule, a voltage $V_{11}$ at the source of the transistor T12 may be a fraction of the supply voltage $V_{PP}$. A voltage $V_{15}$ at the drain of the transistor T15 may be a fraction of the supply voltage $V_{PP}$. A voltage $V_{18}$ at the drain of the transistor T18 may be a fraction of the supply voltage $V_{PP}$. The drain of the transistor T1N is biased at the voltage $V_X$, which is a fraction of the supply voltage VPP. In some embodiments, when all of the transistors T11 to T1N and T21 to T2M are turned off, the ratio of the voltage $V_X$ to the supply voltage $V_{PP}$ $\Sigma_i^M$ RBl/(($\Sigma_i^M$ RBl+ $\Sigma_k^N$ RAk). The resistance RBM may be lower than the resistance RAN. Hence, the voltage $V_X$ may be, for example, one order of magnitude lower than the supply voltage $V_{PP}$. The transistors T11 to T1N each has a bulk (e.g., bulks PB11, PB12, PB15, PB18, and PB1N in FIG. 2). The bulk PB1N of the transistor T1N is connected to the supply voltage $V_{PP}$. Therefore, a high reverse voltage (e.g., the voltage difference between the supply voltage $V_{PP}$ and the voltage $V_X$) may cross a junction of the drain and the bulk of the transistor T1N. The reverse-biased drain-bulk junction of the transistor T1N may induce a non-unneglectable reverse-biased leakage current. Similarly, the reverse-biased drain-bulk junction or source-bulk junction of the transistors T15, T18 (or the transistors T14, T16, T17 (not shown)) may induce a non-unneglectable reverse-biased leakage current.

The transistors T21 to T2M each has a bulk (e.g., bulks PB21, PB22, PB25, PB29, and PB2M in FIG. 2). The bulk PB2M of the transistor T2M is connected to the supply voltage $V_{PP}$. Based on the voltage divider rule, the source (or the drain) of the transistor T2M is biased at a voltage even lower than the voltage $V_X$ at the node 11X. Therefore, a high reverse voltage may cross a junction of the drain and the bulk of the transistor T2M. The reverse-biased drain-bulk junction of the transistor T2M may induce a non-unneglectable reverse-biased leakage current.

As shown in FIG. 2, an emulated resistor $R_{j1}$ emulates the equivalent resistance of the reverse-biased drain-bulk junction of the transistor T1N, which form a parallel circuit with the first variable resistor circuit 11A. Subsequently, the resistance $R_{j1}$ of the first variable resistor circuit 11A equals the equivalent resistance of the resistors RA1 to RAN and the emulated resistor $R_{j1}$ connected in parallel. As shown in FIG. 2, emulated resistors $R_{j2}$, $R_{j3}$, $R_{j4}$, $R_{jM}$ emulates the equivalent resistance of the reverse-biased drain-bulk junction of each of the transistors T22, T25, T28, and T2M. The emulated resistors $R_{j2}$, $R_{j3}$, $R_{j4}$, $R_{jM}$ and the second variable resistor circuit 11B form a parallel circuit. Subsequently, the resistance RB of the second variable resistor circuit 11B equals the equivalent resistance of the resistors RB1 to RBM and the emulated resistors $R_{j2}$, $R_{j3}$, $R_{j4}$, $R_{jM}$ connected in parallel.

The emulated-resistor-induced offset (the unwanted change) of the resistance RA of the first variable resistor circuit 11A and/or the resistance RB of the second variable resistor circuit 11B may cause the change in voltage $V_X$ at the node 11X, for example, increasing the voltage $V_X$. The comparator 12 in FIG. 1 generates the output signal $V_{OUT}$ based on the comparison of the voltage $V_X$ and the reference voltage $V_{REF}$. The voltage pumping control circuit 13 adjusts the supply voltage $V_{PP}$ based on the output signal $V_{OUT}$, such that the voltage $V_X$ approaches and ultimately equals the reference voltage $V_{REF}$. Subsequently, the supply voltage $V_{PP}$ is inevitably shifted from a predetermined value. Owing to the emulated resistors $R_{j1}$, $R_{j2}$, $R_{j3}$, $R_{j4}$, $R_{jM}$, the voltage divider 11 is unable to stabilize the supply voltage $V_{PP}$ but causes the offset of the supply voltage $V_{PP}$.

Figure 3:
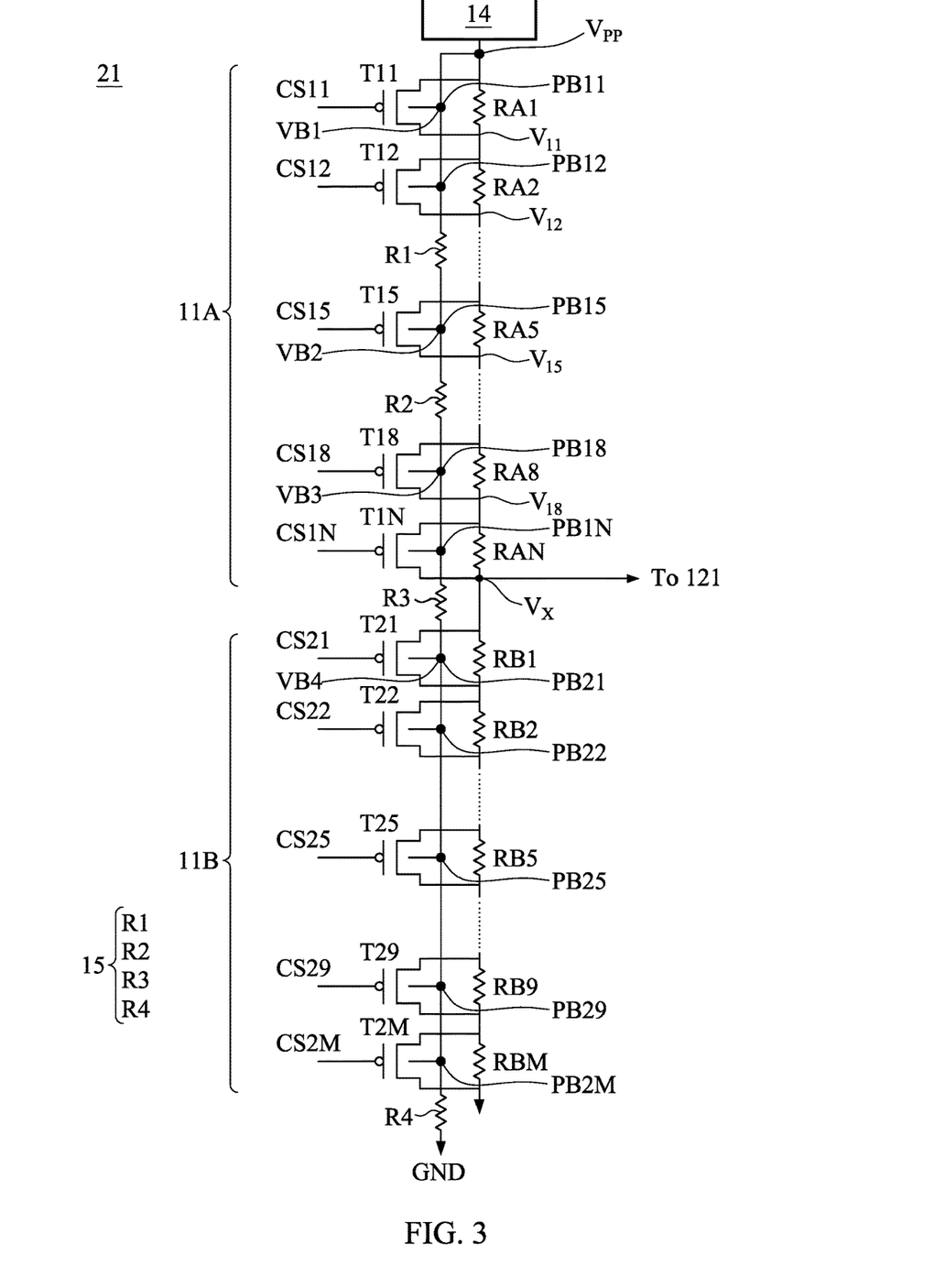
FIG. 3 is a schematic diagram of a voltage divider in accordance with some embodiments of the present disclosure.

FIG. 3 is a schematic diagram of a voltage divider (or an electronic device) 21 in accordance with some embodiments of the present disclosure. The characteristics of the elements with the same reference numerals as those in FIG. 3 can be referred to the relevant descriptions of FIG. 2. The voltage divider 11 of the electronic device 100 of FIG. 1 may be replaced by the voltage divider 21 of FIG. 3.

The voltage divider 21 includes a bulk voltage circuit 15. In some embodiments, the electronic device 100 of FIG. 1 may include a bulk voltage circuit 15 connecting the output terminal 14 and the voltage divider 21. Referring again to FIG. 3, the bulk voltage circuit 15 connects the output terminal 14 and the bulk of each of the transistors T11 to T1N of the first variable resistor circuit 11A. For example, the bulk voltage circuit 15 may connect the output terminal 14 and the bulk PB15 of the transistors T15. The bulk voltage circuit 15 may connect the output terminal 14 and the bulk PB1N of the transistors T1N. The bulk voltage circuit 15 connects the output terminal 14 and the bulk of each of the transistors T21 to T2M of the second variable resistor circuit 11B. For example, the bulk voltage circuit 15 may connect the output terminal 14 and the bulk PB21 of the transistors T21. The bulk voltage circuit 15 may connect the output terminal 14 and the bulk PB2M of the transistors T2M.

The bulk voltage circuit 15 includes a plurality of resistors R1, R2, R3, and R4 connected in series. The resistors R1, R2, R3, and R4 of the bulk voltage circuit 15 connect the output terminal 14 and the ground GND. In some embodiments, the resistor R1 may connect to the output terminal 14 and the resistor R4 may connect to the ground GND. The resistor R1 connects the output terminal 14 and the bulk PB15 of the transistor T15. The resistor R2 connects the output terminal 14 and the bulk PB18 of the transistor T18. In some embodiments, the resistor R2 may connect the bulk PB15 of the transistor T15 and the bulk PB18 of the transistor T18. The resistor R3 connects the output terminal 14 and the bulk PB21 of the transistor T21. In some embodiments, the resistor R3 may connect the bulk PB18 of the transistor T18 and the ground GND. The resistor R3 may connect the bulk PB1N of the transistor T1N and the bulk PB21 of the transistor T21. The resistor R4 connects the bulk PB2M of the transistor T2M and the ground GND. The resistance of R1, R2, R3, and R4 will be indicated as the reference numerals R1, R2, R3, and R4 for the purpose of brevity.

The bulk voltage circuit 15 is configured as a voltage divider. The bulk voltage circuit 15 is configured to distribute the voltage supply $V_{PP}$ among the resistors R1, R2, R3, and R4. The bulk voltage circuit 15 is configured to generate a plurality of voltages based on the supply voltage $V_{PP}$ at the output terminal 14, The bulk voltage circuit 15 may be configured to provide a voltage VB1 to at least one of the bulks PB11 to PB14 of the transistors T11 to T14. The bulk voltage circuit 15 may be configured to provide a voltage VB2 to at least one of the bulks PB15 to PB17 of the transistors T15 to T17. The bulk voltage circuit 15 may be configured to provide a voltage VB3 to at least one of the bulks PB18 to PB1N of the transistors T18 to T1N. The bulk voltage circuit 15 may be configured to provide a voltage VB4 to at least one of the bulks PB21 to PB2M of the transistors T21 to T2M. In other words, the first variable resistor circuit 11A receives at least one of the voltages VB1, VB2, and VB3; and the second variable resistor circuit 11B receives the voltage VB4. The voltage VB1 may be the same as the supply voltage $V_{PP}$. Based on the voltage divider rule, each of the voltages VB2, VB3, and VB4 is a fraction of the supply voltage $V_{PP}$. In some embodiments, the voltages VB2, VB3, and VB4 are different from the supply voltage $V_{PP}$. In some embodiments, the voltages VB2, VB3, and VB4 are lower than the supply voltage $V_{PP}$. The magnitude of the voltages VB2, VB3, and VB4 depends on the resistance of the resistors RI, R2, R3, and R4. In some embodiments, the ratio of the voltage VB2 to the voltage VB3 equals (R2+R3+R4)/(R3+R4). In some embodiments, the ratio of the voltage VB3 to the voltage VB4 equals (R3+R4)/R4. In some embodiments, the ratio of the voltage VB1 to the voltage VB2 equals (R1+R2+R3+R4)/(R2+R3+R4).

In some embodiments, the voltage VB4 is lower than the voltages VB1, VB2, and VB3. In some embodiments, the voltage VB3 is lower than the voltages VB1 and VB2. In some embodiments, the voltage VB2 is lower than the voltage VB1. The relatively low voltage VB4 is received by at least one of the bulks PB21 to PB2M of the transistors T21 to T2M. As such, the reverse voltage crosses the bulk (e.g., the bulk P1315, PB18, or PB IN) and the source or drain of the transistor (e.g., the transistor T15, T18, or TIN) of the first variable resistor circuit 11A may be in a moderate range, e.g., lower than the reverse voltage crossing the bulk applied with the supply voltage $V_{PP}$ and the source/drain of the transistor in FIG. 2. For example, the voltage difference between the voltage Vis (at the drain of the transistor T15) and the voltage VB2, which is applied on the drain-bulk junction of the transistor T15, may be in a moderate range of around 0.8V to around 1.2V when the supply voltage $V_{PP}$ is 3V. Similarly, the reverse voltage across the bulk (e.g., the bulk PB21, PB22, PB25, PB29, or PB2M) and the source or drain of the transistor (e.g., the transistor T21, T22, T25, T28, or T2M) of the second variable resistor circuit 11B may be in a moderate range. The moderate reverse voltage crossing the bulk-source junction or bulk-drain junction of the transistor induces a relatively low, or even negligible reverse leakage circuit. The emulated resistance of bulk-source junction or bulk-drain junction may be sufficiently high to be considered an open-circuit. Hence, the moderately, reverse-biased junction of the source/drain and the bulk of the transistor would not influence the voltage division of the first variable resistor circuit 11A and the second variable resistor circuit 11B. This addresses the emulated-resistor-induced offset of the resistance RA of the first variable resistor circuit 11A and/or the resistance RB of the second variable resistor circuit 11B. The supply voltage $V_{PP}$ may be retained at a predetermined value. Furthermore, the bulk voltage circuit 15 may avoid a forward bias on the source-bulk junction or the drain-bulk junction. The resistance of the resistors R1, R2, R3, and R4 may be adjusted to determine each of the voltages VB2, VB3, and VB4.

In some embodiments, the bulk voltage circuit 15 may include a plurality of electrical impedances in series. FIG. 3 illustrates the exemplary resistors R1, R2, R3, and R4 in series. In some embodiments, the bulk voltage circuit 15 may include electrical impedances composed of resistors, inductors and/or capacitors.

Figure 4:
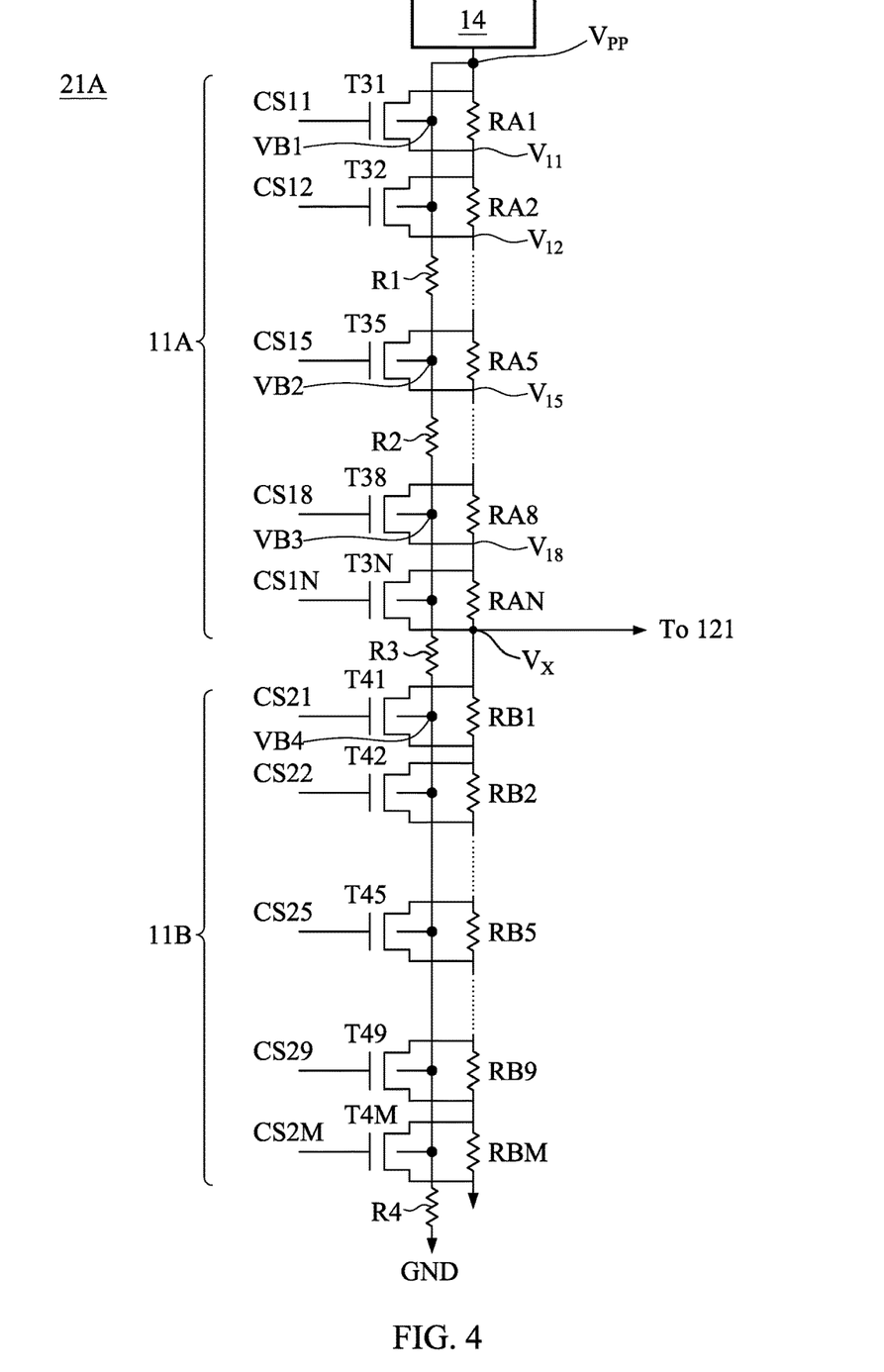
FIG. 4 is a schematic diagram of a voltage divider in accordance with some embodiments of the present disclosure.

FIG. 4 is a schematic diagram of a voltage divider (or an electronic device) 21A in accordance with some embodiments of the present disclosure. The voltage divider 21A of FIG. 4 is similar to the voltage divider 21 of FIG. 3 with differences therebetween as follows.

The first variable transistor circuit 11A of FIG. 4 includes n-type transistors T31 to T3N, rather than the p-type transistors T11 to T1N of FIG. 3. The first variable transistor circuit 11B of FIG. 4 includes n-type transistors T41 to T4M, rather than the p-type transistors T11 to T1N of FIG. 3. The bulk voltage circuit 15 may provide a plurality of voltages to the bulks of the transistors T31 to T3N and T41 to T4M. Hence, the moderately, reverse-biased junction of the source/drain and the bulk of the transistor would not influence the voltage division of the first variable resistor circuit 11A and the second variable resistor circuit 11B.

Figure 5:
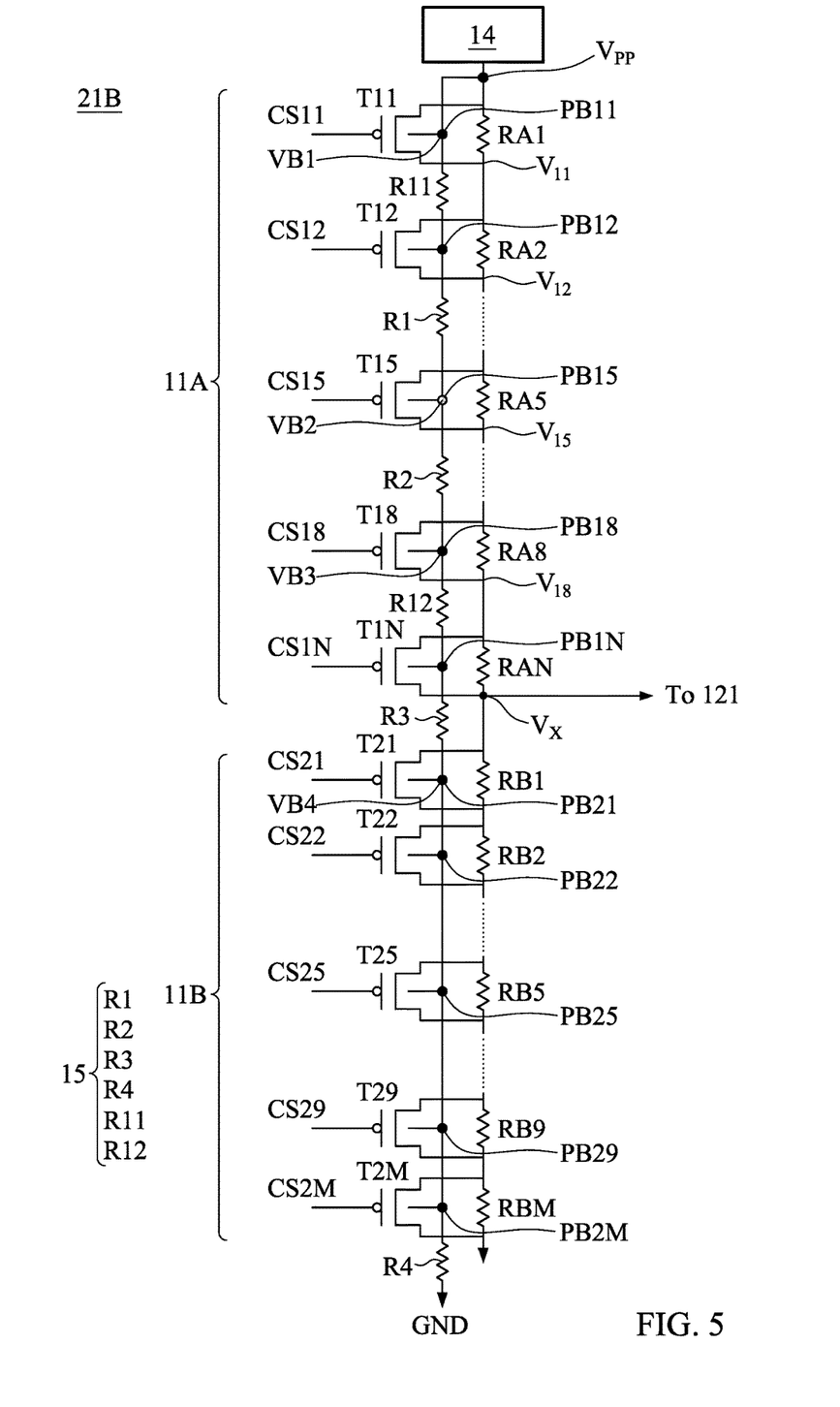
FIG. 5 is a schematic diagram of a voltage divider in accordance with some embodiments of the present disclosure.

FIG. 5 is a schematic diagram of a voltage divider (or an electronic device) 21B in accordance with some embodiments of the present disclosure. The voltage divider 21B of FIG. 5 is similar to the voltage divider 21 of FIG. 3 with differences therebetween as follows.

When the transistors T11 to TIN are turned off, a portion of the supply voltage $V_{PP}$ crosses the corresponding one or more of the resistors RA1 to RAN. Therefore, the voltage at the source/drain of the each transistors T11 to T1N are different. For example, the voltage $V_{15}$ at the drain of the transistor $T_{15}$ may be lower than the voltage $V_{12}$ at the drain of the transistor T12, and the voltage $V_X$ at the drain of the transistor TIN may be lower than the voltage $V_{18}$ at the drain of the transistor T18. The bulk voltage circuit 15 includes a plurality of resistors connected between each of the bulks of the transistors of the first variable resistor circuit 11A. For example, the bulk voltage circuit 15 includes a resistor R11 connecting the bulk PB11 of the transistor T11 and the bulk PB12 of the transistor T12. The bulk voltage circuit 15 further includes a resistor R12 connecting the bulk PB18 of the transistor T18 and the bulk PB1N of the transistor T1N. Thus, the voltage division of the bulk voltage circuit 15 has a higher resolution. Voltages provided to the bulk of the transistor may gradually decrease to comply with the reductive trend of the voltages at the source/drain of the transistors. The voltage across the source-bulk junction or drain-bulk junction may be within a moderate range or a predetermined value (e.g., around 1V, when the supply voltage $V_{PP}$ is 3V). The bulk voltage circuit 15 is configured to provide a plurality of voltages to each of the bulks of the transistors of the first variable resistor circuit 11A in a more precise manner.

In some embodiments, the bulk voltage circuit 15 includes a plurality of resistors connected between each of the bulks of the transistors of the second variable resistor circuit 11B. The bulk voltage circuit 15 is configured to provide a plurality of voltages to each of the bulks of the transistors of the second variable resistor circuit 11B in a more precise manner.

Figure 6:
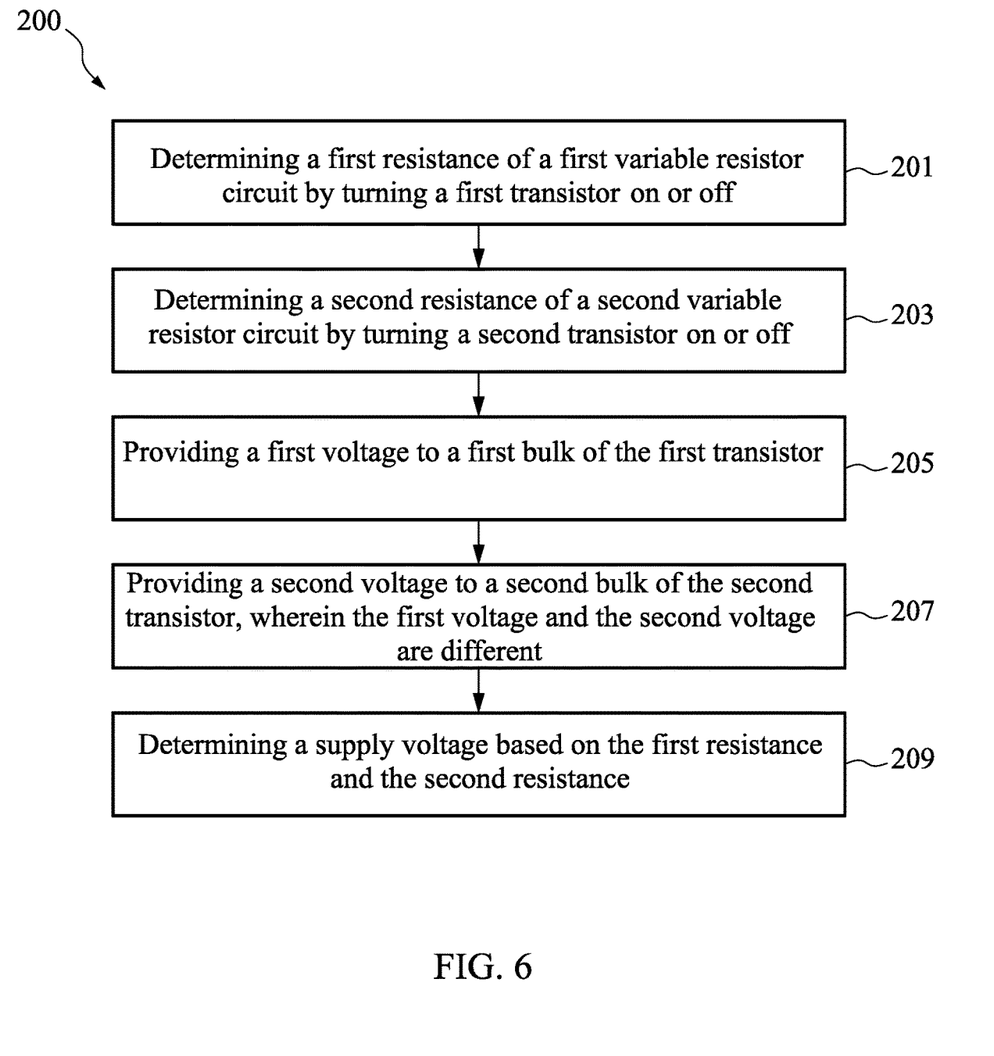
FIG. 6 is a flowchart of a method of controlling an electronic device, in accordance with some embodiments of the present disclosure.

FIG. 6 is a flowchart of a method 200 of controlling an electronic device in accordance with some embodiments of the present disclosure.

The method 200 begins with operation 5201 including determining a first resistance of a first variable resistor circuit (e.g., the resistance RA of the first variable resistor circuit 11A) by turning a first transistor on or off (e.g., one of the transistors T11 to T1N).

The method 200 continues with operation S203 including determining a second resistance of a second variable resistor circuit (e.g., the resistance RB of the second variable resistor circuit 11B) by turning a second transistor on or off (e.g., one of the transistors T21 to T2M).

The method 200 continues with operation S203 including providing a first voltage (e.g., the voltage VB2) to a first bulk of the first transistor (e.g., the bulk PB15 of the transistor T15).

The method 200 continues with operation S205 including providing a second voltage (e.g., the voltage VB4) to a second bulk of the second transistor (e.g., the bulk PB21 of the transistor T21). The first voltage and the second voltage are different The method 200 may include providing a plurality of voltages to the bulk of each of a plurality of transistors.

The method 200 continues with operation S207 including determining a supply voltage (e.g., the supply voltage $V_{PP}$) based on the first resistance and the second resistance. The operation 5207 may include comparing a voltage at a terminal (e.g., the voltage Vx at the node 11X) between the first variable resistor circuit and the second variable resistor circuit and a reference voltage (e.g., the reference voltage $V_{REF}$) to generate an output signal (e.g., the output signal $V_{OUT}$). The operation S207 may further include adjusting the supply voltage based on the output signal.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 6. In some embodiments, the method to 200 can include one or more operations depicted in FIG. 6.

One aspect of the present disclosure provides an electronic device including a first transistor having a first resistor, second resistor, first transistor, and second transistor. The second resistor is connected to the first resistor. The first transistor is connected to the first resistor in parallel and has a first bulk. The second transistor is connected to the second resistor in parallel and has a second bulk. The first bulk of the first transistor receives a first voltage and the first bulk of the second. transistor receives a second voltage. The first voltage and the second voltage are different.

Another aspect of the present disclosure provides an electronic device including a voltage divider, an output terminal, and a bulk voltage circuit. The voltage divider includes a first variable resistor circuit and a second variable resistor circuit. The output terminal is connected to the voltage divider. The bulk voltage circuit is configured to generate a first voltage and a second, different, voltage based on a supply voltage at the output terminal. The first variable resistor circuit receives the first voltage and the second variable resistor circuit receives the second voltage.

Another aspect of the present disclosure provides a method of controlling an electronic device, including determining a first resistance of a first variable resistor circuit by turning a first transistor on or off, determining a second resistance of a second variable resistor circuit by turning a second transistor on or off, providing a first voltage to a first bulk of the first transistor, providing a second voltage to a second bulk of the second transistor, wherein the first voltage and the second voltage are different, and determining a supply voltage based on the first resistance and the second resistance.

The electronic device of the present disclosure includes a first transistor having a first resistor, second resistor, first transistor, and second transistor. The second resistor is connected to the first resistor. The first transistor is connected to the first resistor in parallel and has a first bulk. The second transistor is connected to the second resistor in parallel and has a second bulk. The first bulk of the first transistor receives a first voltage and the first bulk of the second transistor receives a second voltage. The first voltage and the second voltage are different, e.g., the second voltage is lower than the first voltage. When the first transistor and the second transistor are turned off, the first resistor and the second resistor is configured to divide a supply voltage at a terminal of the first resistor. The supply voltage at is distributed to the first resistor and the second resistor which are applied to the source or drain of the first transistor and the second transistor, respectively. The reverse voltage across source/drain and the bulk of the second transistor is in a moderate range. As such, the reverse leakage current between a junction of the source/drain and the bulk of the first and second transistors can be relatively low, or negligible. Hence, the equivalent resistance of the junction of the source/drain and the bulk of the first and second transistors can be sufficiently high to be considered an open-circuit. Thus, the equivalent resistance of the moderately, reverse-biased junction of the source/drain and the bulk of the first and second transistors may not influence the voltage division of the first resistor and the second resistor. Furthermore, the electronic device may include more connected resistors and transistors respectively connected to the corresponding resistors in parallel. The electronic device in the present disclosure is able to generate a plurality of different voltages to the bulks of the transistors. As such, the voltage across the junction of the source/drain and the bulk of each of the transistors can be within a moderate range or at a moderate value. The junction leakage current therebetween may be relatively low and thus, a high equivalent resistance of the junction would not influence the voltage division of the plurality of resistors.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended. to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. An electronic device, comprising:
   a first resistor;
   a second resistor connected to the first resistor;
   a first transistor connected to the first resistor in parallel and having a first bulk;
   a second transistor connected to the second resistor in parallel and having a second bulk;
   an output terminal electrically connected to the first transistor; and
   a bulk voltage circuit comprising a third resistor deposited between the first bulk of the first transistor and the second bulk of the second transistor, wherein the output terminal, the first bulk of the first transistor, the third resistor of the bulk voltage circuit, and the second bulk of the second transistor are electrically connected in series, wherein the first bulk of the first transistor receives a first voltage and the first bulk of the second transistor receives a second voltage, and wherein the first voltage and the second voltage are different;

wherein the bulk voltage circuit includes a fourth resistor connecting the second bulk of the second transistor to ground, and the ratio of the first voltage and the second voltage equals an overall resistance of the third resistor and the fourth resistor over a resistance of the fourth resistor.

2. The electronic device of claim 1, wherein the output terminal has a supply voltage, and wherein the bulk voltage circuit is configured to generate the first voltage and the second voltage based on the supply voltage.

3. The electronic device of claim 1, wherein the supply voltage, the first voltage, and the second voltage are different.

4. The electronic device of claim 1, further comprising a fifth resistor electrically connecting the second resistor and the ground.

5. The electronic device of claim 4, further comprising a third transistor connected to the fifth resistor in parallel, wherein the third transistor has a third bulk receiving a third voltage, the third voltage is different from the first voltage and the second voltage, and the bulk voltage circuit includes a sixth resistor connecting the fourth resistor to ground.

6. The electronic device of claim 1, further comprising a seventh resistor electrically connecting the output terminal and the first resistor, and a fourth transistor connected to the seventh resistor in parallel; wherein the fourth transistor has a fourth bulk receiving a supply voltage, and the bulk voltage circuit includes an eighth resistor connecting the first resistor and the output terminal.

7. The electronic device of claim 1, wherein the first transistor has a source electrically connected to a drain of the second transistor, and the voltage across the drain and the second bulk of the second transistor is in a range from 0.8V to 1.2V.

8. The electronic device of claim 1, wherein the transistor includes a p-type MOSFET or n-type MOSFET, and the electronic device is configured to divide a supply voltage at the output terminal into the first voltage and the second voltage.

9. An electronic device, comprising:

a voltage divider comprising a first variable resistor circuit and a second variable resistor circuit, wherein the first variable resistor circuit includes a first transistor and the second variable resistor circuit includes a second transistor, wherein the first transistor has a first bulk receives a first voltage and a second transistor has a second bulk receives the second voltage, wherein the first variable resistor circuit includes a first resistor connected to the first transistor in parallel and the second variable resistor circuit includes a second resistor connected to the second transistor in parallel;

an output terminal connected to the first variable resistor circuit of the voltage divider; and a bulk voltage circuit configured to generate the first voltage and the second voltage based on a supply voltage at the output terminal, wherein the bulk voltage circuit comprising a third resistor deposited between the first bulk of the first transistor and the second bulk of the second transistor, wherein the output terminal, the first bulk of the first transistor, the third resistor of the bulk voltage circuit, and the second bulk of the second transistor are electrically connected in series, wherein the first variable resistor circuit receives the first voltage and the second variable resistor circuit receives the second voltage.

10. The electronic device of claim 9, wherein the bulk voltage circuit comprises a fourth resistor connecting the output terminal and the first bulk of the first transistor.

11. The electronic device of claim 9, further comprising a comparator having a first input connected to a node between the first variable resistor circuit and the second variable resistor circuit, a second input receiving a reference voltage, and an output connected to the output terminal; wherein the comparator is configured to generate an output signal at the output of the comparator based on the comparison between an input voltage at the first input and the reference voltage.

12. The electronic device of claim 11, further comprising a voltage pumping control circuit connecting the output terminal and the output of the comparator; wherein the voltage pumping control circuit is configured to change the supply voltage based on the output signal.

13. The electronic device of claim 11, wherein the first variable resistor circuit has a first resistance, RA, and the second variable resistor circuit has a second resistance, RB, and wherein ratio of a voltage at the node and the supply voltage equals RB/(RA+RB).

* * * * *